(12) United States Patent
Riley (10) Patent No.: US 10,706,896 B2
(45) Date of Patent: Jul. 7, 2020

(54) CHARGE PUMP SUPPLY OSCILLATOR

(71) Applicant: Micron Technology, Inc., Boise, ID (US)

(72) Inventor: John E. Riley, McKinney, TX (US)

(73) Assignee: Micron Technology, Inc., Boise, ID (US)

(*) Notice: Subject to any disclaimer, the term of this patent is extended or adjusted under 35 U.S.C. 154(b) by 23 days.

(21) Appl. No.: 16/178,007

(22) Filed: Nov. 1, 2018

(65) Prior Publication Data

US 2020/0143849 A1 May 7, 2020

(51) Int. Cl.
*G11C 5/14* (2006.01)
*H03K 19/21* (2006.01)

(52) U.S. Cl.
CPC .............. *G11C 5/145* (2013.01); *H03K 19/21* (2013.01)

(58) Field of Classification Search
CPC ................................ G11C 5/145; H03K 5/145
USPC ......................................................... 365/227
See application file for complete search history.

(56) References Cited

U.S. PATENT DOCUMENTS

| | | | | |
|---|---|---|---|---|
| 5,941,990 A | * | 8/1999 | Hiiragizawa | G06F 1/3203 713/310 |
| 2010/0148840 A1 | * | 6/2010 | Weng | H02M 3/073 327/291 |
| 2018/0076709 A1 | * | 3/2018 | Lee | H02M 3/073 |

* cited by examiner

*Primary Examiner* — Vu A Le
(74) *Attorney, Agent, or Firm* — Fletcher Yoder, P.C.

(57) ABSTRACT

A memory device includes a plurality of memory cells and first circuitry coupled the plurality of memory cells, wherein the first circuitry is configured to perform a memory operation on at least one memory cell of the plurality of memory cells. The memory device also includes a charge pump coupled to the first circuitry, wherein the charge pump comprises a pump oscillator configured to generate an oscillator signal having only pulses with a width above a predetermined threshold pulse width and a pump core configured to receive the oscillator signal and a first electrical power signal at a first voltage, generate a second electrical power signal at a second voltage based upon the oscillator signal and the first voltage.

20 Claims, 6 Drawing Sheets

CHARGE PUMP SUPPLY OSCILLATOR

BACKGROUND

1. Field of the Present Disclosure

This disclosure relates to memory devices, and more specifically, to charge pump supply circuitry in memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage during data processing operations. To that end, these memory devices may have addressable memory elements arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through an internal data path that may include circuitry for reading or writing data bits in the memory elements.

Several operations in the memory device may employ voltages that may be higher and/or lower than the power supply voltages of the memory device. For example, certain memory devices may be coupled to a power supply with a voltage of about 1.2V and/or about 2.5V, and may have certain operations that employ voltages in a range such as above 2.5V and/or below 0V. To perform such operations, charge pump power supplies, may be employed to provide higher voltages. More generally, charge pumps may be voltage generators that may provide voltages larger than input voltages. As the current and voltage demands of memory devices increase with memory density and memory speed, improvements in the charge pump technology may allow for systems with reduced power consumption and/or improved reliability.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may store data using addressable memory elements (e.g., memory rows or columns), which may be disposed in memory banks. Examples of addressable memory devices include random access memory (RAM) devices, dynamic RAM (DRAM) devices such as synchronous DRAM (SDRAM) devices, double data rate SDRAM devices (e.g., DDR SDRAM, DDR2 SDRAM, DDR3 SDRAM, DDR4 SDRAM), and graphics DDR SDRAM devices (e.g., GDDR3 SDRAM, GDDR4 SDRAM), as well as static RAM (SRAM) devices, and/or flash memory devices, among others.

Processing circuitry in the electronic systems may access (e.g., read/write) the memory elements by interacting with an input/output (I/O) interface and a command interface. As an example, a processor may store information by providing a write command and/or an address for a memory element, and read stored information from a particular memory element from the memory device by providing a read command and/or an address. The commands and/or addresses may be provided via the command interface, and the requested information (e.g., data bits) may be retrieved via the I/O interface.

The power to perform memory operations, such as read, write, or refresh operations, may be obtained from power supply connections (e.g., power supply ($V_{DD}$), activating power supply ($V_{PP}$), ground supply ($V_{SS}$)) with the electronic device. For example, the memory device may have external connections (e.g., pins) associated with power supply connections, which may be coupled to pins in a socket of a printed circuit board (e.g., a motherboard). The voltages and tolerances of the power supply connection may be specified in a standard for the memory device. For example, DDR4 may include a $V_{DD}$ specification of about 1.2V and a $V_{PP}$ specification of about 2.5V. However, certain operations within the memory device may benefit from a higher and/or lower voltage (e.g., above 2.5V and/or below 0V). To that end, the memory devices may include analog power supplies, such as charge pumps and/or charge pump cores, which may be direct current to direct current (DC/DC) converters that generate higher voltages from the voltages provided by the power supply lines.

Charge pumps may, in general, generate voltage increases by employing a switching device (e.g., a transistor) or by switching to controls connections across energy storage devices (e.g., a capacitor). Based on, among other things, the switching frequency, the duty cycle of the switching signal, and the input voltages, a target output voltage and/or the current capacity of the charge pump may be adjusted. Operation of charge pumps may demand substantial currents during short periods of time, to charge the energy storage devices. Furthermore, as the size of memory devices increases and the number of on-die memory increases (e.g., 8 Gb, 16 Gb, 32 Gb per memory die), the number charge pumps on the die may become large. Due to the impact on the operation of the memory devices, strategies in the use of charge pumps during operation may lead to improvements in the performance of the memory device. Embodiments described herein include systems, devices, and methods for memory devices that may allow for improvements to the charge pumps. For example, control of an oscillation signal used to enable the charge pumps may be undertaken so that no pulses of the oscillation signal below a threshold pulse width are generated and utilized in the generation of a charge pump output signal, for example, when the charge pump is switching between operational states.

Figure 1:
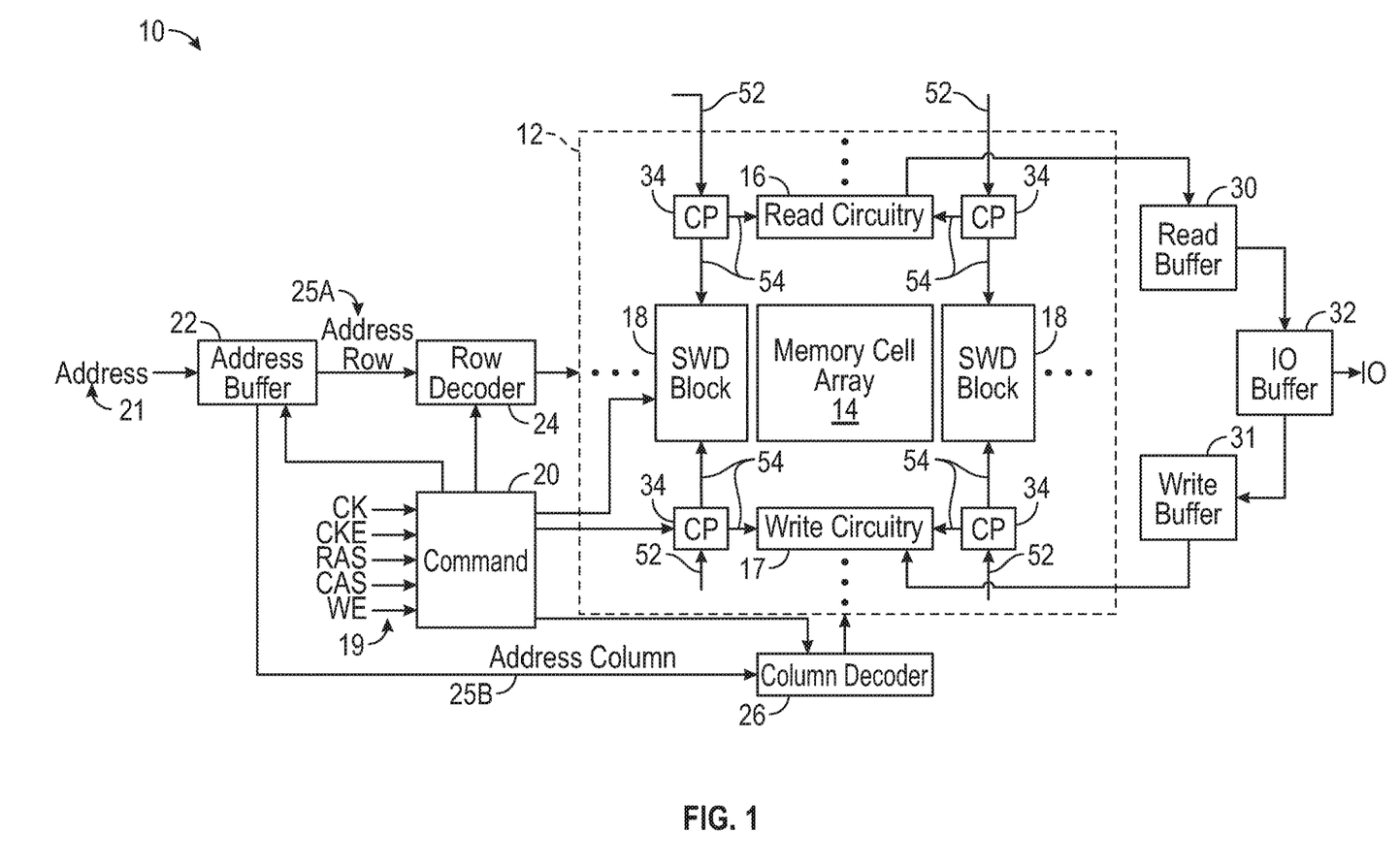
FIG. 1 is a block diagram of a memory device with a configurable number of enabled charge pumps.

With the foregoing in mind, FIG. 1 is a block diagram of a memory device 10. The memory device 10 may have one or more memory banks 12, which may include one or more memory cell arrays 14. Each memory cell array 14 may be coupled to access circuitry, which may include one or more of read circuitry 16, write circuitry 17, and subword driver (SWD) blocks 18. The read circuitry 16, such as one or more read blocks (e.g., sense amplify circuitry), may facilitate read operations and write circuitry 17, such as write blocks, may facilitate write operations. In some embodiments, a single block or circuit may be used to perform part or all of the functions performed by the read circuitry 16 and the write circuitry 17. Read circuitry 16 and/or write circuitry 17 may operate by amplifying and coordinating local input/output (I/O) lines coupled to the memory cell array 14. The memory cell array 14 may also be coupled to the SWD blocks 18. The SWD blocks 18 may facilitate read and write operations by providing voltage that may activate memory rows or memory columns in the memory cell array 14.

Charge pumps 34 may be disposed near memory banks 12 to provide an electrical power signal to the read circuitry 16, write circuitry 17, and/or the SWD blocks 18 (i.e., to power to the access circuitry of the one or more memory banks 12 via the electrical power signal). Moreover, charge pumps 34 may receive one or more electrical power signals 52 (e.g., $V_{DD}$, $V_{PP}$, $V_{SS}$). Each charge pump 34 of the memory device 10 may be, for example, a unique integrated circuit that may be coupled to the one or more memory banks 12 or the memory device 10. Each of the charge pumps 34 of the memory device 10 instead may be, for example, disposed as part of a single integrated circuit that may be coupled to the one or more memory banks 12 or the memory device 10.

Likewise, in some embodiments, the charge pumps 34 may be, for example, a portion of the memory device 10 or the one or more memory banks 12 (i.e., an integrated portion of the memory device 10 or specifically of the one or more memory banks 12).

The logic blocks in the memory banks 12 may be controlled by clock and/or command signals 19, which may be received by a command block 20 (e.g., a memory controller). Command block 20 may decode the clock and/or command signals 19 to generate various signals to control circuitry external to the memory banks 12, such as address buffers 22 and decoders, such as row decoder 24 and column decoder 26, read buffer 30, write buffer 31, and/or input/output (I/O) buffer 32. Command block 20 may also decode the clock and/or command signals 19 to generate various signals to control circuitry internal to the memory banks 12, i.e., internal data circuitry, which may include one or more of read circuitry 16, write circuitry 17, and/or the SWD blocks 18, as well as the charge pumps 34. For example, when an operation demands electrical power signal(s) 54 from the charge pumps 34, the command block 20 may provide instructions to activate one or more of the charge pumps 34 and provide the electrical power signal(s) 54 based on the electrical power signals 52. In order to address data, the address buffer 22 may receive address signal 21. The clock and/or command signals 19 and the address signal 21 may be provided by processing circuitry coupled to the memory device, as discussed above.

In order to manipulate data at an address, an external device may also provide an address signal 21, in addition to the clock and/or command signals 19. The address signal 21 may be decoded in the address buffer 22 into a row address 25A and column address 25B. The row address 25A may be provided to a row decoder 24 and the column address 25B may be provided to a column decoder 26. The row decoder 24 and the column decoder 26 may be used to control the appropriate SWD block 18 to activate the memory cells associated with the requested address signal 21.

For example, in a read operation, the memory cells associated with the row address 25A and the column address 25B may be activated by a SWD block 18, the read circuitry 16 may generate a data read signal, and read buffer 30 and I/O buffer 32 may amplify and transport the read data to an external device. During a write operation, the memory cells associated with the row address 25A and the column address 25B may be activated by the SWD block 18, the I/O buffer 32 may latch the incoming data from the external device, and the write buffer 31 and the write circuitry 17 may store the read data to an external device. Other operations may also be performed, such as refresh operation that refreshes the data in the entire memory device. In the refresh operation, the SWD block 18 may activate all rows in the memory cell array 14 to avoid data loss. In the processes related with these operations, the charge pumps 34 may be activated and/or de-activated to provide adequate voltages, as discussed above.

Figure 2:
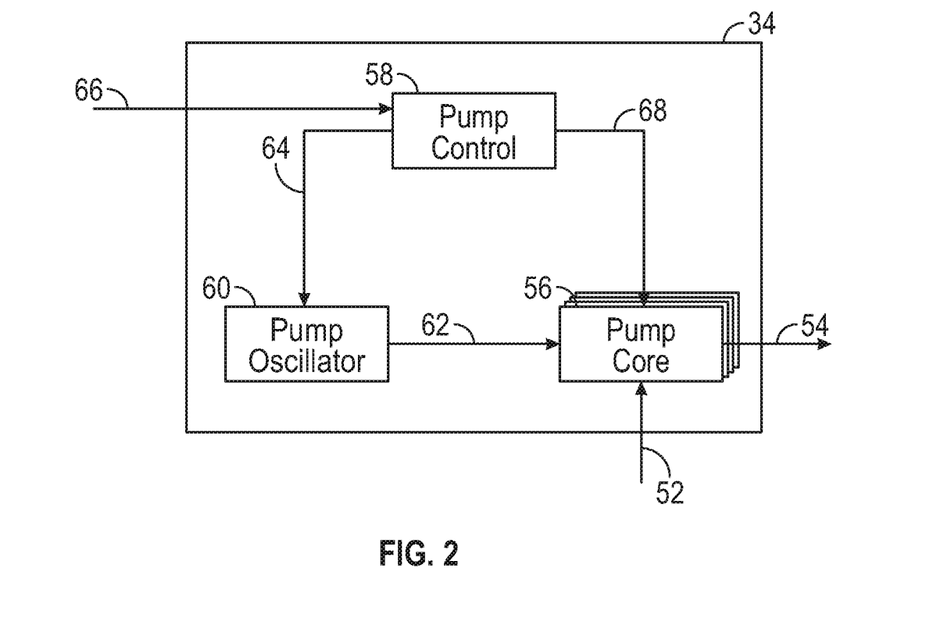
FIG. 2 is a block diagram of a charge pump circuit of FIG. 1.

FIG. 2 illustrates a block diagram 50 of a charge pump 34, which may enabled or disabled, as discussed herein. The block diagram 50 is provided to illustrate general functionality of a charge pump 34, and it is understood that the methods and systems described herein may be adjusted and/or applied to other charge pump systems. As discussed above, the charge pump 34 may operate as a direct current to direct current (DC/DC) converter that receives one or more input electrical power signals 52 and may provide an electrical power signal 54 with a higher voltage. To that end, the charge pump 34 may have one or more pump cores 56, each of which may include switching circuitry and energy storage circuitry and each of which may transmit a particular electrical power signal 54 (e.g., for use in a particular component coupled thereto). The switching circuitry may include, for example, transistors and/or diodes and the energy storage circuitry may include, for example, capacitors.

Charge pump 34 may also include a pump controller 58 and a pump oscillator 60. The pump oscillator 60 may provide an oscillator signal 62 that regulates the operation of the pump cores 56. The frequency and/or the duty cycle of the oscillator signal 62 may be controlled to change the voltage level and/or the available current of the electrical power signal(s) 54, i.e., a pump core 56 receive the oscillator signal 62 and generates an electrical power signal 54 based in part upon the oscillator signal 62. The pump controller 58 may be coupled to sensors (e.g., voltage sensors or other feedback circuitry) that monitor the electrical power signal (s) 54 of the pump cores 56 and adjust the operation of the pump oscillator 60 accordingly (e.g., by transmission of control signal 64, which may be more than one control signal 64, utilized by the pump oscillator 60 to switch between operating modes). For example, if the current demands on the pump cores 56 cause a voltage drop in the electrical power signal(s) 54, the pump controller 58 may sense the voltage drop and cause the pump oscillator 60 to increase its frequency to provide more charge (e.g., through the transmission of the control signal 64 to the pump oscillator 60).

The charge pump 34 may also receive a control signal 66 (e.g., one or more control signals 66) from a memory device controller (e.g., command block 20), for example, to enable, disable, and/or adjust a mode of operation of the charge pump cores 56. The pump controller 58 may receive the control signal 66 and enable the charge pump cores 56 using an activating signal 68 (e.g., one or more activating signals 68) to program the charge pump 34 and/or individual charge pump cores 56. Similarly, the pump controller 58 may generate the control signal 64 based upon or due to reception of the control signal 66.

Figure 3:
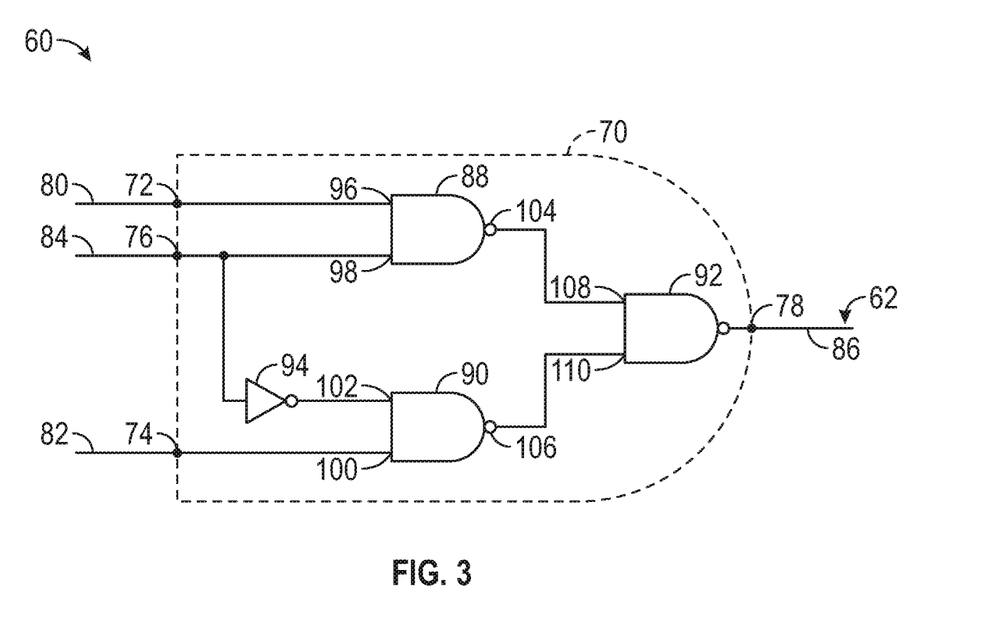
FIG. 3 is block diagram of an embodiment of the charge pump oscillator of FIG. 2.

FIG. 3 illustrates an oscillation selection circuit 70 as a portion of the pump oscillator 60 of FIG. 2. As illustrated, the oscillation selection circuit 70 may include input 72, input 74, input 76, and output 78. Each of input 72, input 74, and input 76 (as well as any other inputs described herein) may be, for example, pins or other connectors. Input 72, input 74, and input 76 may be coupled to respective line 80, line 82, and line 84. Each of line 80, line 82, and line 84 (as well as any other lines described herein) may be metal or other conductive material pathways or connections. Output 78 (as well as any other outputs described herein) may be, for example, pins or other connectors. Output 78 may provide oscillator signal 62 from the pump oscillator 60.

In some embodiments, line 80 transmits an oscillation signal (e.g., a clock signal) having a first frequency (i.e., a FastOsc signal) that corresponds to a high frequency oscillator signal (e.g., useful when high currents are to be provided from the charge pump 34 in conjunction with, for example, a high power mode of operation of the memory device 10 and/or components therein whereby the memory device 10 and/or its components utilize more current and/or power relative to a low power mode of operation). Likewise, line 82 may transmit an oscillation signal (e.g., a clock signal) having a second frequency that is less than the first frequency (i.e., a SlowOsc signal) that corresponds to a low frequency oscillator signal (e.g., useful when low currents are to be provided from the charge pump 34 in conjunction with, for example, a low power mode of operation of the memory device 10 and/or components therein whereby the memory device 10 and/or its components consume less current and/or power relative to a high power mode of operation). The FastOsc signal and the SlowOsc signal may have differing frequencies and duty cycles since, based at least in part on the switching frequency and the duty cycle of the switching signal (e.g., the oscillator signal 62), a target output voltage and/or the current capacity of the charge pump 34 may be adjusted.

The pump oscillator 60 may include one or more clock generating circuits able to generate clock signals at differing rates (e.g., the SlowOsc signal, the FastOsc signal, and additional clock signals at different frequencies). These clock signals may be generated based upon the control signal 64 received by the pump oscillator 60 or, in other embodiments, a control signal may be provided to the pump oscillator 60, for example, from the command block 20 to be used in locally generating the clock signals in the pump oscillator 60. Alternatively, a system clock or the command block 20 may provide a clock signal to the charge pumps 34 (e.g., to the pump oscillator 60 of the charge pump 34) that is modified by the pump oscillator 60 to generate, for example, clock signals at differing rates, such as the SlowOsc signal and the FastOsc signal. In other embodiments, a system clock or the command block 20 may directly transmit the clock signals at differing rates to the charge pumps 34 (e.g., directly to the pump oscillator 60 of the charge pump 34 or to the pump oscillator 60 via the pump controller 58) for use therein. As illustrated, the clock signals of different frequencies may be transmitted to the input 72 and the input 74 of the oscillation selection circuit 70 via the line 80 and the line 82.

A mode enable signal (e.g., a FastOscEn signal) may be transmitted along line 84 to input 76. The mode enable signal may be (or may be part of) the control signal 64 received by the pump oscillator 60 or, in other embodiments, the based upon a control signal received from the command block 20 (e.g., the control signal 66). Likewise, the mode enable signal may be directly received as control signal 64 or control signal 66 and transmitted to the oscillation selection circuit 70 via line 84 and input 76 or may be generated by the pump oscillator 60 based upon the control signal 64 or control signal 66. As will be described in greater detail below, the mode enable signal can indicate a mode of operation of the memory device 10 and/or the components therein (i.e., whether the memory device 10 and/or the components therein is in a low power mode of operation or is entering into a low power mode of operation and can indicate whether the memory device 10 and/or components therein is in a high power mode of operation or is entering into a high power mode of operation). The mode enable signal may be utilized by the oscillation selection circuit 70 to select one of the clock signals received at input 72 and input 74 (e.g., select one of the FastOsc signal and the SlowOsc signal), whereby selection of one of the clock signals corresponds to an operating mode of the memory device 10 and/or components therein (i.e., selection of the SlowOsc signal when the memory device 10 and/or components therein are operating in a low power mode of operation and selection of the FastOsc signal when the memory device 10 and/or components therein are operating in a high power mode of operation).

As illustrated, the oscillation selection circuit 70 may include circuitry (e.g., selection circuitry) that operates to select one of the input oscillation signals having a differing frequencies (i.e., selection of the SlowOsc signal or the FastOsc signal) for transmission from output 78 as the oscillator signal 62. The selection of these input oscillation signals may be controlled by the mode enable signal (e.g., the FastOscEn signal) received at input 76. As illustrated, the oscillation selection circuit 70 includes NAND gate 88, NAND gate 90, and NAND gate 92 as well as an inverter 94 as selection circuitry. However, alternative selection circuitry may be utilized to select one of the clock signals transmitted to the oscillation selection circuit 70 in conjunction with, for example, operational modes of the memory device 10 and/or components therein.

In operation, the NAND gate 88 may receive, at input 96, the first clock signal from input 72 (e.g., the clock signal corresponding to the FastOsc signal having a faster frequency than the SlowOsc signal). The NAND gate 88 may also receive, at input 98, the mode enable signal (e.g., the FastOscEn signal) received from input 76. The NAND gate 90 may receive at input 100 the second clock signal from input 74 (e.g., corresponding to a second clock signal, the SlowOsc signal having a slower frequency than the FastOsc signal). The NAND gate may also receive, at input 102, an inverted mode enable signal (e.g., the binary compliment of the FastOscEn signal) received from inverter 94, which, as illustrated, is coupled to input 76. The output 104 of the NAND gate 88 is coupled to an input 108 of NAND gate 92. Likewise, the output 106 of the NAND gate 90 is coupled to an input 110 of NAND gate 92. The NAND gate 92 may include or may be coupled to the output 78 of the oscillation selection circuit 70, i.e., a pin coupled to line 86, which may provide oscillator signal 62 from the pump oscillator 60.

The oscillation selection circuit 70 may utilize the mode enable signal (e.g., the FastOscEn signal) to control selection of transmission of the first clock signal from input 72 (e.g., the clock signal corresponding to the FastOsc signal having a faster frequency than the SlowOsc signal) and selection of transmission of the second clock signal from input 74 (e.g., the clock signal corresponding to the SlowOsc signal having a slower frequency than the FastOsc) as the oscillator signal 62 transmitted from the pump oscillator 60. This selection may be made based upon an operating mode of, for example, the memory device 10 and/or components therein.

For example, selection of the SlowOsc signal may be accomplished when the mode enable signal has a first state (e.g., a binary low or "0" state) that corresponds to a low power mode of operation of the memory device 10 and/or components therein. The mode enable signal having a first state (binary low) received at input 98 causes the output 104 of the NAND gate 88 to be at (transmit) a binary high (or "1") signal, regardless of the binary value of the FastOsc signal received at input 98. Similarly, when the mode enable signal having the first state (binary low), inverted by the inverter 94 to have a second binary state (binary high or "1"), is received at input 102, this causes the output 106 of the NAND gate 90 to mirror (transmit) a binary signal that corresponds to the inverse of the binary value of the SlowOsc signal received at input 100. That is, when the signal received at input 102 is a high (or "1") signal, the output 106 of the NAND gate 90 will be equivalent to the inverse of the binary value of the input 100 (i.e., the inverse binary value of the SlowOsc signal received by the input 100, such that if the SlowOsc signal is a binary 1, the output 106 will be a binary 0 and if the SlowOsc signal is a binary 0, the output 106 will be a binary 1).

The signal from NAND gate 88 (from output 104 of NAND gate 88) is transmitted to input 108 of NAND gate 92 and the signal from NAND gate 90 (from output 106 of NAND gate 90) is transmitted to the input 110 of the NAND gate 92. As the signal from NAND gate 88 is binary high (when the mode enable signal has a binary low state), this causes the output 78 of the NAND gate 92 to mirror (transmit) a binary signal that corresponds to the inverse binary value of signal received at input 110, which is the SlowOsc signal. Thus, when the mode enable signal has a binary low state, the SlowOsc signal is transmitted via output 78 as the oscillator signal 62. This transmission of the SlowOsc signal as the oscillator signal 62 may correspond to a low power mode of operation of the of the memory device 10 and/or components therein and, accordingly, the oscillation selection circuit 70 may utilize the mode enable signal to transmit an oscillator signal 62 for a low power mode of operation of the memory device 10 and/or components. Likewise, the oscillation selection circuit 70 may utilize the mode enable signal to transmit an oscillator signal 62 for a high power mode of operation of the memory device 10 and/or components.

The oscillation selection circuit 70 select FastOsc signal for transmission as the oscillator signal 62 when the mode enable signal has a second state (e.g., a binary high or "1" state) that corresponds to a high power mode of operation of the memory device 10 and/or components therein. The mode enable signal having the second state (binary high) received at input 98 causes the output 104 of the NAND gate 88 to mirror (transmit) a binary signal that corresponds to the inverse of the binary value of the FastOsc signal received at input 96. That is, when the signal received at input 96 is a high (or "1") signal, the output 104 of the NAND gate 88 will be equivalent to the inverse of the binary value of the input 96 (i.e., the inverse binary value of the FastOsc signal received by the input 96, such that if the FastOsc signal is a binary 1, the output 104 will be a binary 0 and if the FastOsc signal is a binary 0, the output 104 will be a binary 1). The mode enable signal having the second state (binary high), inverted by inverter 94 to be a binary low, causes the output 106 of the NAND gate 90 to be at (transmit) a binary high (or "1") signal, regardless of the binary value of the SlowOsc signal received at input 100.

The signal from NAND gate 88 (from output 104 of NAND gate 88) is transmitted to input 108 of NAND gate 92 and the signal from NAND gate 90 (from output 106 of NAND gate 90) is transmitted to the input 110 of the NAND gate 92. As the signal from NAND gate 90 is binary high (when the mode enable signal has a binary high state), this causes the output 78 of the NAND gate 92 to mirror (transmit) a binary signal that corresponds to the inverse binary value of signal received at input 108, which is the FastOsc signal. Thus, when the mode enable signal has a binary high state, the FastOsc signal is transmitted via output 78 as the oscillator signal 62. This transmission of the FastOsc signal as the oscillator signal 62 may correspond to a high power mode of operation of the memory device 10 and/or components therein and, accordingly, the oscillation selection circuit 70 may utilize the mode enable signal to transmit an oscillator signal 62 for a high power mode of operation of the memory device 10 and/or components. A timing diagram illustrative of the operation of the oscillation selection circuit 70 in generating an oscillator signal 62 based upon the mode enable signal (e.g., the FastOscEn signal) is illustrated in FIG. 4.

Figure 4:
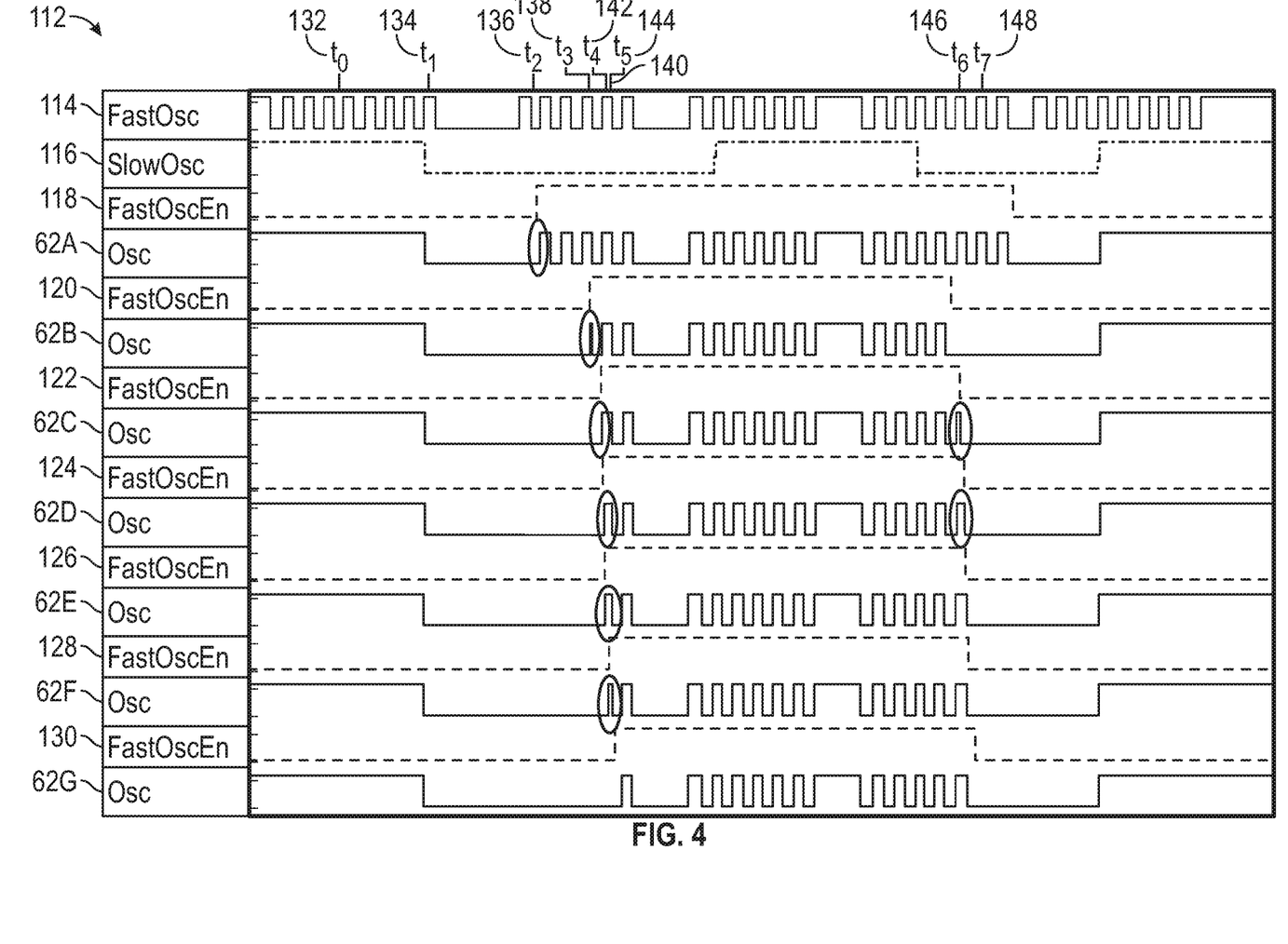
FIG. 4 is timing diagram of operation of the embodiment of the charge pump oscillator of FIG. 3.

FIG. 4 is a timing diagram 112 illustrative of the operation of the charge pump oscillator 60 having the oscillation selection circuit 70 in generating an oscillator signal 62 based upon the mode enable signal (e.g., the FastOscEn signal) as described above with respect to FIG. 3. As illustrated, a first clock signal is the FastOsc signal 114 (e.g., a first clock signal received at input 72 of the oscillation selection circuit 70). A second clock signal is the SlowOsc signal 116 (e.g., a second clock signal received at input 74 of the oscillation selection circuit 70). Mode enable signal 118 is the FastOscEn signal and FIG. 4 additionally illustrates the oscillator signal (Osc) 62A as the oscillator signal 62 resulting from the mode enable signal 118. Likewise, FIG. 4 illustrates mode enable signal 120 and its corresponding oscillator signal (Osc) 62B, mode enable signal 122 and its corresponding oscillator signal (Osc) 62C, mode enable signal 124 and its corresponding oscillator signal (Osc) 62D, mode enable signal 126 and its corresponding oscillator signal (Osc) 62E, mode enable signal 128 and its corresponding oscillator signal (Osc) 62F, and mode enable signal 130 and its corresponding oscillator signal (Osc) 62G. The timing diagram 112 of FIG. 4 additionally illustrates a first time $t_0$ 132, a second time $t_1$ 134, a third time $t_2$ 136, a fourth time $t_3$ 138, and a time period 140 starting at a fifth time $t_4$ 142 and ending at a sixth time $t_5$ 144, as well as a seventh time $t_6$ 146 and an eighth time $t_7$ 148.

For the first time t₀ 132, each of mode enable signal 118, mode enable signal 120, mode enable signal 122, mode enable signal 124, mode enable signal 126, mode enable signal 128, and mode enable signal 130 are illustrated as being a binary low ("0") signal. Accordingly, as described above with respect to FIG. 3, the SlowOsc signal 116 (e.g., a binary high or "1") is transmitted as the Osc 62A, the Osc 62B, the Osc 62C, the Osc 62D, the Osc 62E, the Osc 62F, and the Osc 62G from the pump oscillator 60 at the first time $t_0$ 132 in response to each of the mode enable signal 118, mode enable signal 120, mode enable signal 122, mode enable signal 124, mode enable signal 126, mode enable signal 128, and mode enable signal 130 being received as a binary low ("0") signal at the first time $t_0$ 132. Likewise, as similarly described above with respect to FIG. 3, the SlowOsc signal 116 (e.g., a binary low or "0") is transmitted as the Osc 62A, the Osc 62B, the Osc 62C, the Osc 62D, the Osc 62E, the Osc 62F, and the Osc 62G from the pump oscillator 60 at the second time $t_1$ 134 in response to each of the mode enable signal 118, mode enable signal 120, mode enable signal 122, mode enable signal 124, mode enable signal 126, mode enable signal 128, and mode enable signal 130 being received as a binary low ("0") signal as the SlowOsc signal 116 transitions from a binary high ("1") signal to a binary low ("0") signal at the second time $t_1$ 134.

As further illustrated in the timing diagram 112, at the third time $t_2$ 136, a mode enable signal 118 transitions from a from a binary low ("0") signal to a binary high ("1") signal. This corresponds to the memory device 10 and/or components transitioning from a low power mode of operation into a high power mode of operation. As illustrated, the transition of the mode enable signal 118 from a from a binary low ("0") signal to a binary high ("1") signal is accompanied in a switch of the Osc 62A from mirroring the SlowOsc signal 116 to mirroring the FastOsc signal 114 (i.e., the Osc 62A is increased in frequency from the frequency of the SlowOsc signal 116 to the frequency of the FastOsc signal 114 at the third time $t_2$ 136). This results in a pulse generated for the Osc 62A at the third time $t_2$ 136. However, as illustrated, the width of the pulse generated for the Osc 62A at the third time $t_2$ 136 may be shorter in width than subsequent pulses for the Osc 62A, due to, for example, the transition of the Osc 62A occurring when the FastOsc signal 114 is in a different binary state than the binary state of the SlowOsc signal 116 (i.e., due to the operation of the oscillation selection circuit 70 in switching of the Osc 62A from having a frequency equivalent to the SlowOsc signal 116 to having a frequency equivalent to the FastOsc signal 114 while the binary states of the FastOsc signal 114 and the SlowOsc signal 116 are different).

Likewise, in a separate operation from the operation discussed above regarding mode enable signal 118, the mode enable signal 120 may instead transition from a from a binary low ("0") signal to a binary high ("1") signal at a fourth time $t_3$ 138 instead of at the third time $t_2$ 136. This corresponds to the memory device 10 and/or components transitioning from a low power mode of operation into a high power mode of operation at the fourth time $t_3$ 138. As illustrated, the transition of the mode enable signal 120 from a from a binary low ("0") signal to a binary high ("1") signal is accompanied in a switch of the Osc 62B from mirroring the SlowOsc signal 116 to mirroring the FastOsc signal 114 (i.e., the Osc 62B is increased in frequency from the frequency of the SlowOsc signal 116 to the frequency of the FastOsc signal 114 at the fourth time $t_3$ 138). This results in a pulse generated for the Osc 62B at the fourth time $t_3$ 138. However, as illustrated, the width of the pulse generated for the Osc 62B at the fourth time $t_3$ 138 may be shorter in width than subsequent pulses for the Osc 62B, due to, for example, the transition of the Osc 62B occurring when the FastOsc signal 114 is in a different binary state than the binary state of the SlowOsc signal 116 (i.e., due to the operation of the oscillation selection circuit 70 in switching of the Osc 62B from having a frequency equivalent to the SlowOsc signal 116 to having a frequency equivalent to the FastOsc signal 114 while the binary states of the FastOsc signal 114 and the SlowOsc signal 116 are different).

In other operations separate from the operations discussed above regarding mode enable signal 118 and mode enable signal 120, the mode enable signal 122 may instead transition from a from a binary low ("0") signal to a binary high ("1") signal during a time period 140 starting at a fifth time $t_4$ 142 and ending at a sixth time $t_5$ 144 instead of at the third time $t_2$ 136 or the fourth time $t_3$ 138. This corresponds to the memory device 10 and/or components transitioning from a low power mode of operation into a high power mode of operation at various times during the time period 140. As illustrated, the transition of the mode enable signal 122 from a from a binary low ("0") signal to a binary high ("1") signal is accompanied in a switch of the Osc 62C from mirroring the SlowOsc signal 116 to mirroring the FastOsc signal 114 (i.e., the Osc 62C is increased in frequency from the frequency of the SlowOsc signal 116 to the frequency of the FastOsc signal 114 at the fifth time $t_4$ 142). This results in a pulse generated for the Osc 62C at the fifth time $t_4$ 142. However, as illustrated, the width of the pulse generated for the Osc 62C at the fifth time $t_4$ 142 may be shorter in width than subsequent pulses for the Osc 62C, due to, for example, the transition of the Osc 62C occurring when the FastOsc signal 114 is in a different binary state than the binary state of the SlowOsc signal 116 (i.e., due to the operation of the oscillation selection circuit 70 in switching of the Osc 62C from having a frequency equivalent to the SlowOsc signal 116 to having a frequency equivalent to the FastOsc signal 114 while the binary states of the FastOsc signal 114 and the SlowOsc signal 116 are different).

Similarly, the transition of the mode enable signal 124, the mode enable signal 126, and the mode enable signal 128 from a from a binary low ("0") signal to a binary high ("1") signal is accompanied in a switch of the respective Osc 62D, Osc 62E, and Osc 62F from mirroring the SlowOsc signal 116 to mirroring the FastOsc signal 114 (i.e., the Osc 62D, Osc 62E, and Osc 62F are increased in frequency from the frequency of the SlowOsc signal 116 to the frequency of the FastOsc signal 114 between the fifth time $t_4$ 142 and the sixth time $t_5$ 144). This results in an initial pulse generated for the Osc 62D, Osc 62E, and Osc 62F having a width that may be shorter in width than subsequent pulses for the Osc 62D, Osc 62E, and Osc 62F, due to, for example, the transition of the Osc 62D, Osc 62E, and Osc 62F occurring when the FastOsc signal 114 is in a different binary state than the binary state of the SlowOsc signal 116 (i.e., due to the operation of the oscillation selection circuit 70 in switching of the Osc 62D, Osc 62E, and Osc 62F from having a frequency equivalent to the SlowOsc signal 116 to having a frequency equivalent to the FastOsc signal 114 while the binary states of the FastOsc signal 114 and the SlowOsc signal 116 are different).

In other operations separate from the operation discussed above regarding the mode enable signal 118, mode enable signal 120, mode enable signal 122, mode enable signal 124, mode enable signal 126, and mode enable signal 128, the mode enable signal 130 may instead transition from a from a binary low ("0") signal to a binary high ("1") signal subsequent to the sixth time $t_5$ 144. This corresponds to the memory device 10 and/or components transitioning from a low power mode of operation into a high power mode of operation subsequent to the sixth time $t_5$ 144. As illustrated, the transition of the mode enable signal 130 from a from a binary low ("0") signal to a binary high ("1") signal is accompanied in a switch of the Osc 62G from mirroring the SlowOsc signal 116 to mirroring the FastOsc signal 114 (i.e., the Osc 62G is increased in frequency from the frequency of the SlowOsc signal 116 to the frequency of the FastOsc signal 114 subsequent to the sixth time $t_5$ 144). This results in a pulse generated for the Osc 62G subsequent to the sixth time $t_5$ 144. The width of the all the pulses generated for the Osc 62G may be equivalent due to the transition of the Osc 62G occurring when the FastOsc signal 114 is in the same binary state as the binary state of the SlowOsc signal 116 (i.e., due to the operation of the oscillation selection circuit 70 in switching of the Osc 62G from having a frequency equivalent to the SlowOsc signal 116 to having a frequency equivalent to the FastOsc signal 114 while the binary states of the FastOsc signal 114 and the SlowOsc signal 116 are the same).

As further illustrated in the timing diagram 112, similar shortened pulses, for example, in the Osc 62C and Osc 62D, when the transition of the mode enable signals 122 and 124 from a from a binary high ("1") signal to a binary low ("0") signal occurs, as accompanied by a switch of the respective Osc 62C and Osc 62D from mirroring the FastOsc signal 114 to mirroring the SlowOsc signal 116 (i.e., the Osc 62C and the Osc 62D are decreased in frequency from the frequency of the FastOsc signal 114 to the frequency of the SlowOsc signal 116 at the seventh time $t_6$ 146 and the eighth time $t_7$ 148, respectively). This results in a pulse generated for the Osc 62C and the Osc 62D at the seventh time $t_6$ 146 and the eighth time $t_7$ 148, respectively, that may be shorter in width than previous for the Osc 62C and the Osc 62D, due to, for example, the transition of the Osc 62C and the Osc 62D occurring when the FastOsc signal 114 is in a different binary state than the binary state of the SlowOsc signal 116 (i.e., due to the operation of the oscillation selection circuit 70 in switching of the Osc 62C and the Osc 62D from having a frequency equivalent to the SlowOsc signal 116 to having a frequency equivalent to the FastOsc signal 114 while the binary states of the FastOsc signal 114 and the SlowOsc signal 116 are different). In some embodiments, it may be beneficial to transmit an oscillator signal 62 (i.e., each of Osc 62A, Osc 62B, Osc 62C, Osc 62D, Osc 62E, Osc 62F, and Osc 62G) as a pulse stream having pulses of the same width, as generation of pulses with shorter widths (e.g. runt pulses) can result in a pulse stream for the oscillator signal 62 that has a frequency that exceeds a maximum allowable frequency for the memory device 10 and/or components therein.

Figure 5:
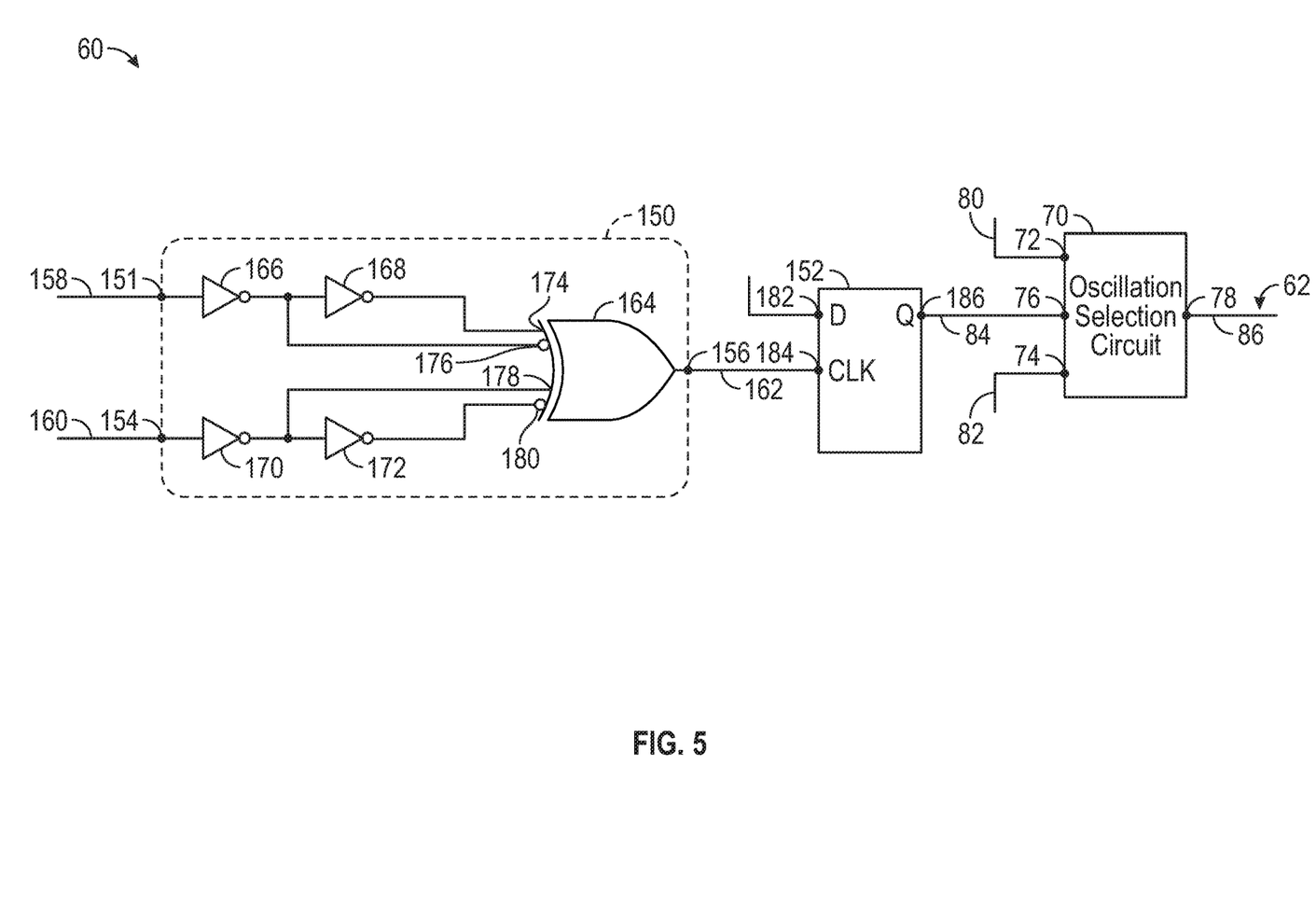
FIG. 5 is block diagram of a second embodiment of the charge pump oscillator of FIG. 2.

FIG. 5 illustrates another embodiment of the pump oscillator 60 that may prevent runt pulses in the oscillator signal 62 during operating mode changes of the memory device 10 and/or components therein. The pump oscillator 60 includes a mode transition control circuit 150, a latching circuit 152, and the oscillation selection circuit 70. As will be described in detail below, the mode transition control circuit 150 may operate in conjunction with the latching circuit 152 to prevent transition of the oscillator signal 62 when the binary states of the FastOsc signal 114 and the SlowOsc signal 116 are different. This may eliminate runt pulses in the oscillator signal 62 during operating mode changes of the memory device 10 and/or components therein. In this manner, the a pump oscillator 60 generates an oscillator signal 62 having only pulses with a width above a predetermined threshold pulse width (i.e., the oscillator signal 62 as having pulses not less than the width of the pulses of the FastOsc signal 114).

As illustrated, the mode transition control circuit 150 includes an input 153, an input 154, and an output 156. Each of input 153 and input 154 may be coupled to respective line 158 and line 160. Likewise, output 156 may be coupled to line 162, which may provide a selection signal (e.g., a pulsed signal or a clock signal) to the latching circuit 152.

In some embodiments, line 158 transmits an oscillation signal (e.g., a clock signal) having a first frequency (i.e., the FastOsc signal) that corresponds to a high frequency oscillator signal (e.g., useful when high currents are to be provided from the charge pump 34 in conjunction with, for example, a high power mode of operation of the memory device 10 and/or components therein whereby the memory device 10 and/or its components utilize more current and/or power relative to a low power mode of operation). Likewise, line 160 may transmit an oscillation signal (e.g., a clock signal) having a second frequency that is less than the first frequency (i.e., the SlowOsc signal) that corresponds to a low frequency oscillator signal (e.g., useful when low currents are to be provided from the charge pump 34 in conjunction with, for example, a low power mode of operation the memory device 10 and/or components therein whereby the memory device 10 and/or its components utilize less current and/or power relative to a high power mode of operation).

As previously discussed, the pump oscillator 60 may include one or more clock generating circuits able to generate clock signals at differing rates (e.g., the SlowOsc signal, the FastOsc signal, and additional clock signals at different frequencies). These clock signals may be generated based upon the control signal 64 received by the pump oscillator 60 or, in other embodiments, a control signal may be provided to the pump oscillator 60, for example, from the command block 20 to be used in locally generating the clock signals in the pump oscillator 60. Alternatively, a system clock may provide a clock signal to the charge pumps 34 (e.g., to the pump oscillator 60 of the charge pump 34) that is modified by the pump oscillator 60 to generate, for example, clock signals at differing rates, such as the SlowOsc signal and the FastOsc signal. In other embodiments, a system clock or the command block 20 may directly transmit differing clock signals to the charge pumps 34 (e.g., directly to the pump oscillator 60 of the charge pump 34 or to the pump oscillator 60 via the pump controller 58) for use therein. As illustrated, the clock signals of different frequencies may then be transmitted to the input 153 and the input 154 of the mode transition control circuit 150 as well as to the input 72 and the input 74 of the oscillation selection circuit 70 via line 158, line 160, line 80, and line 82, respectively.

The mode transition control circuit 150 receives may include circuitry that operates to transmit an indication of whether the input oscillation signals have the same binary state as one another (i.e., both of the SlowOsc signal and the FastOsc signal have a binary high or "1" value or a binary low or "0" value) for transmission via output 156. As previously noted, transitioning from a low power mode of operation of the memory device 10 and/or components therein to a high power mode of operation (and vice versa) when the input oscillation signals (the SlowOsc signal and the FastOsc signal) have different binary states may result in runt pulses in the pulse stream for the oscillator signal 62, which may result in a frequency of the oscillator signal 62 that exceeds a maximum allowable frequency for the memory device 10 and/or components therein. Accordingly, the mode transition control circuit 150 may operate to transmit a selection signal (e.g., a pulsed signal or a clock signal) via line 162 that indicates when the SlowOsc signal and the FastOsc signal have different binary states, which may be used, for example, by the latching circuit 152 to prevent transitioning from a low power mode of operation of the memory device 10 and/or components therein to a high power mode of operation (and vice versa).

As illustrated, the mode transition control circuit 150 includes a (four-input) XOR gate 164 as well as inverter 166, inverter 168, inverter 170, and inverter 172. In operation, the XOR gate 164 may receive, at input 174, the first clock signal from input 153 (e.g., the clock signal corresponding to the FastOsc signal having a faster frequency than the SlowOsc signal) as having passed through inverter 166 and inverter 168, which results in a binary value at the input 174 equivalent to the binary value of the FastOsc signal. The XOR gate 164 may also receive, at input 176, the first clock signal from input 153 (e.g., the FastOsc signal) as having passed through inverter 166, which results in a binary value at the input 176 equivalent to the inverse of the binary value of the FastOsc signal (e.g., the binary compliment of the FastOsc signal). The XOR gate 164 may receive at input 178 the second clock signal from input 154 (e.g., corresponding to a second clock signal, the SlowOsc signal having a slower frequency than the FastOsc signal) as having passed through inverter 170, which results in a binary value at the input 178 equivalent to the inverse of the binary value of the SlowOsc signal (e.g., the binary compliment of the SlowOsc signal). The XOR gate 164 may receive at input 180 the second clock signal from input 154 (e.g., the SlowOsc signal) as having passed through inverter 170 and inverter 172, which results in a binary value at the input 180 equivalent to the binary value of the SlowOsc signal.

Because, as illustrated, input 176 and input 180 are negative inputs of the XOR gate 164, the XOR gate 164 will generate a result based on an inverted value of the binary value received at the input 176 and the input 180. Thus, for example, if FastOsc is a binary low and SlowOsc is a binary low, the XOR gate 164 will generate a binary high value of "1" at output 156 (e.g., the binary value at input 174 of a "0" and the binary value at input 176 of a "1" inverted via the negative input to a "0", resulting in a XOR value attributable to FastOsc of "0" and the binary value at input 178 of a "1" and the binary value at input 180 of a "0" inverted via the negative input to a "1", resulting in an XOR value attributable to SlowOsc of "1", with the XOR gate 164 generating a result of "1" based on the difference in binary state of the XOR value attributable to SlowOsc and the XOR value attributable to FastOsc). Likewise, for example, if FastOsc is a binary high and SlowOsc is a binary high, the XOR gate 164 will generate a binary high value of "1" at output 156 (e.g., the binary value at input 174 of a "1" and the binary value at input 176 of a "0" inverted via the negative input to a "1", resulting in a XOR value attributable to FastOsc of "1" and the binary value at input 178 of a "0" and the binary value at input 180 of a "1" inverted via the negative input to a "0", resulting in an XOR value attributable to SlowOsc of "0", with the XOR gate 164 generating a result of "1" based on the difference in binary state of the XOR value attributable to SlowOsc and the XOR value attributable to FastOsc).

Conversely, for example, if FastOsc is a binary low and SlowOsc is a binary high, the XOR gate 164 will generate a binary low value of "0" at output 156 (e.g., the binary value at input 174 of a "0" and the binary value at input 176 of a "1" inverted via the negative input to a "0", resulting in a XOR value attributable to FastOsc of "0" and the binary value at input 178 of a "0" and the binary value at input 180 of a "1" inverted via the negative input to a "0", resulting in an XOR value attributable to SlowOsc of "0", with the XOR gate 164 generating a result of "0" based on the common binary state of the XOR value attributable to SlowOsc and the XOR value attributable to FastOsc). Similarly, for example, if FastOsc is a binary high and SlowOsc is a binary low, the XOR gate 164 will generate a binary low value of "0" at output 156 (e.g., the binary value at input 174 of a "1" and the binary value at input 176 of a "0" inverted via the negative input to a "1", resulting in a XOR value attributable to FastOsc of "1" and the binary value at input 178 of a "1" and the binary value at input 180 of a "0" inverted via the negative input to a "1", resulting in an XOR value attributable to SlowOsc of "1", with the XOR gate 164 generating a result of "0" based on the common binary state of the XOR value attributable to SlowOsc and the XOR value attributable to FastOsc).

In this manner, the binary value at output 156 is binary high ("1") when the FastOsc signal and the SlowOsc signal are in a common binary state. Furthermore, the binary value at output 156 is binary low ("0") when the FastOsc signal and the SlowOsc signal are in differing (i.e., inverse) binary states. Thus, the mode transition control circuit 150 operates to generate and transmit an indication of whether the input oscillation signals have the same binary state as one another (i.e., both of the SlowOsc signal and the FastOsc signal have a binary high or "1" value or a binary low or "0" value). The mode transition control circuit 150 may transmit this indication (e.g., a selection signal as a pulsed signal or a clock signal) via line 162 to the latching circuit 152.

The latching circuit 152 may include input 182, input 184, and output 186. In some embodiments, the latching circuit 152 may be a D-flip-flop. The input 182 may receive a mode enable signal (e.g., the FastOscEn signal). The mode enable signal may be generated, for example, based upon the control signal 64 received by the pump oscillator 60 or, in other embodiments, based upon a control signal received from the command block 20 (e.g., the control signal 66). The mode enable signal may indicate the memory device 10 and/or components therein operating in a low power mode of operation or a high power mode of operation and transition of the mode enable signal (e.g., the FastOscEn signal) from, for example, a binary low to a binary high indicates a transition or change from the low power mode of operation to a high power mode of operation, while transition of the mode enable signal (e.g., the FastOscEn signal) from, for example, a binary high to a binary low indicates a transition or change from the high power mode of operation to the low power mode of operation. The input 184 of the latching circuit 152 may receive the indication from the output 156 of the mode transition control circuit 150 (e.g., the selection signal as a pulsed signal or a clock signal) via the line 162.

The latching circuit 152 may operate to generate and transmit a latched mode enable signal (e.g., a FastOscEnL signal) from the output 186 based upon the mode enable signal (e.g., the FastOscEn signal) received at input 182 and the indication received at input 184. For example, where the latching circuit 152 is a D flip-flop, the input 182 may be a D-input, the input 184 may be a clock-input of the flip-flop, and the output 186 may be a Q-output of the flip flop. The D-flip flop will transmit from output 186 the binary value at the input 182 when the binary value at the input 184 is a binary high. If the binary value at the input 184 transitions to a binary low from a binary high, the output 186 will continue to transmit whatever binary value was at input 182 when the input 184 was a binary high. When the binary value at the input 184 transitions from a binary low to a binary high again, the output 186 will transmit whatever binary value is currently present at input 182.

In this manner, transitions at input 182 are not transmitted from output 186 if the binary value at input 184 is low. That is, the input 182 of the latching circuit 152 (and not the input 76 of the oscillation selection circuit 70) receives the mode enable signal (e.g., the FastOscEn signal) and, thus, transition of the mode enable signal from low to high (indicating moving from a low power mode of operation to a high power mode of operation of the memory device 10 and/or components therein) or from high to low (indicating moving from a high power mode of operation to a low power mode of operation of the memory device 10 and/or components therein) will not be transmitted as a mode enable signal for the oscillation selection circuit 70 via line 84 to input 76 to generate the oscillator signal 62 unless clocked by a binary high value at input 184 of the latching circuitry 152 (indicative of a common binary state of the FastOsc signal and the SlowOsc signal). Instead, a latched mode enable signal (e.g., the FastOscEnL signal) from the output 186 is transmitted to the input 76 of the oscillation selection circuit 70 and this latched mode enable signal does not transition unless the binary states of the FastOsc signal and the SlowOsc signal are the same, since the latching circuit 152 transmits a latched mode enable signal to the oscillation selection circuit 70 based upon the signal (e.g., the binary value) transmitted from the mode transition control circuit 150 (i.e., when the value of the signal transmitted from the mode transition control circuit 150 is a binary high value "1"). Thus, the mode transition control circuit 150 and the latching circuit 152 operate to preclude switching of the oscillator signal 62 by the oscillation selection circuit 70 when the FastOsc signal and the SlowOsc signal are in different (i.e., inverse) binary states by preventing transition of the mode enable signal (i.e., the FastOscEnL signal) transmitted to the oscillation selection circuit 70 when the FastOsc signal and the SlowOsc signal are in different (i.e., inverse) binary states, which may eliminate runt pulses in the oscillator signal 62 during operating mode changes of the memory device 10 and/or components therein.

Figure 6:
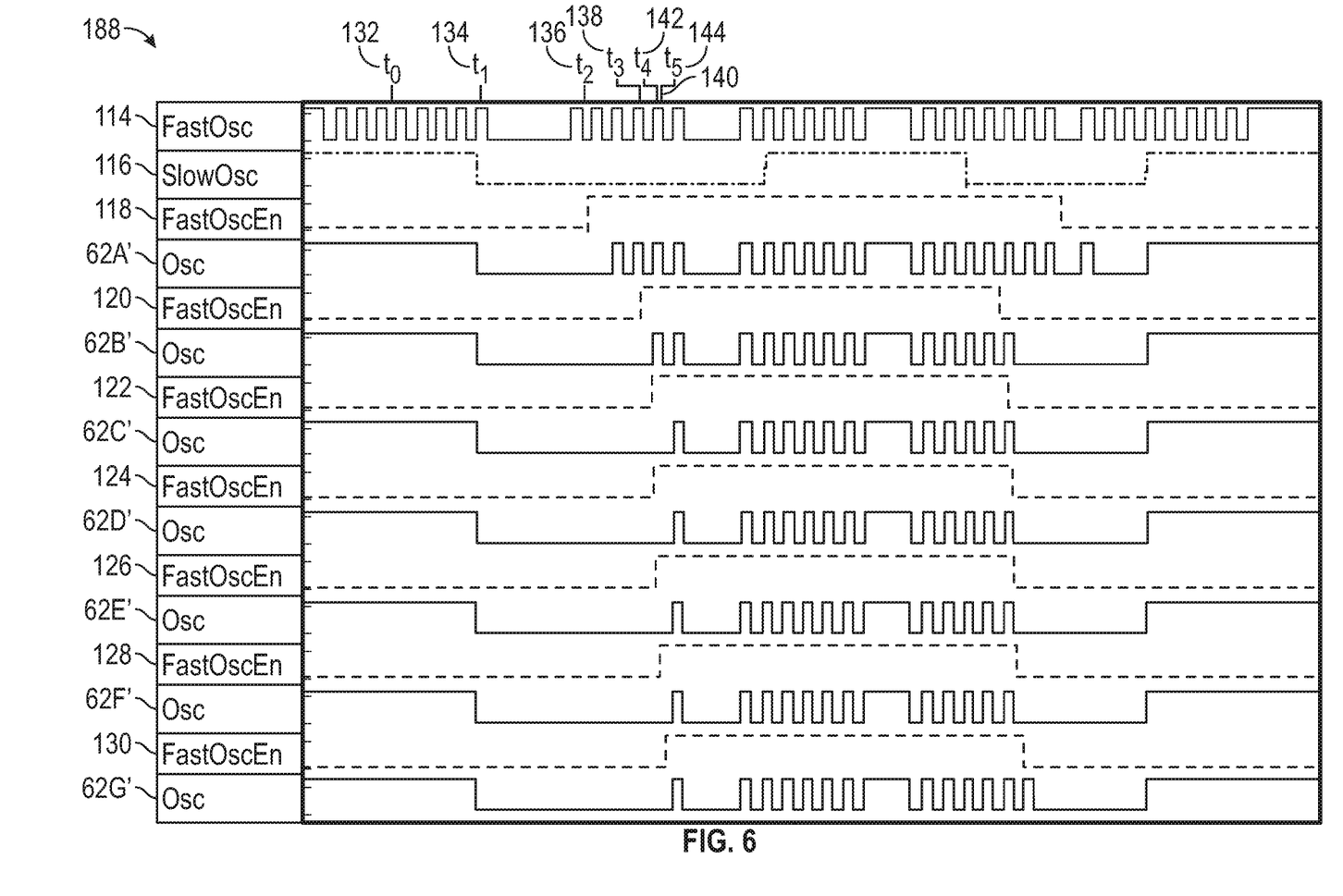
FIG. 6 is timing diagram of operation of the second embodiment of the charge pump oscillator of FIG. 5.

FIG. 6 is a timing diagram 188 illustrative of the operation of the charge pump oscillator 60 having the oscillation selection circuit 70 in generating an oscillator signal 62 based upon the mode enable signal (e.g., the FastOscEn signal), as controlled by the mode transition control circuit 150 and the latching circuit 152 in the manner described above with respect to FIG. 5. As illustrated, a first clock signal is the FastOsc signal 114 (e.g., a first clock signal received at input 72 of the oscillation selection circuit 70) while a second clock signal is the SlowOsc signal 116 (e.g., a second clock signal received at input 74 of the oscillation selection circuit 70). Mode enable signal 118 is the FastOscEn signal transmitted to the input 182 of the latching circuit 152 and FIG. 6 additionally illustrates the oscillator signal (Osc) 62A' as the oscillator signal 62 resulting from the mode enable latch signal FastOscEnL that is transmitted from the latching circuit 152 to the input 76 of the oscillation selection circuit 70 based upon the mode enable signal 118.

FIG. 6 also illustrates mode enable signal 120 transmitted to the input 182 of the latching circuit 152 and the corresponding oscillator signal (Osc) 62B' resulting from the mode enable latch signal that is generated based upon the mode enable signal 120, mode enable signal 122 transmitted to the input 182 of the latching circuit 152 and the corresponding oscillator signal (Osc) 62C' resulting from the mode enable latch signal that is generated based upon the mode enable signal 122, mode enable signal 124 transmitted to the input 182 of the latching circuit 152 and the corresponding oscillator signal (Osc) 62D' resulting from the mode enable latch signal that is generated based upon the mode enable signal 124, mode enable signal 126 transmitted to the input 182 of the latching circuit 152 and the corresponding oscillator signal (Osc) 62E' resulting from the mode enable latch signal that is generated based upon the mode enable signal 126, mode enable signal 128 transmitted to the input 182 of the latching circuit 152 and the corresponding oscillator signal (Osc) 62F' resulting from the mode enable latch signal that is generated based upon the mode enable signal 128, and mode enable signal 130 transmitted to the input 182 of the latching circuit 152 and the corresponding oscillator signal (Osc) 62G' resulting from the mode enable latch signal that is generated based upon the mode enable signal 130. The timing diagram 188 of FIG. 6 additionally illustrates a first time $t_0$ 132, a second time $t_1$ 134, a third time $t_2$ 136, a fourth time $t_3$ 138, and a time period 140 starting at a fifth time $t_4$ 142 and ending at a sixth time $t_5$ 144, as well as a seventh time $t_6$ 146 and an eighth time $t_7$ 148.

For the first time $t_0$ 132, each of mode enable signal 118, mode enable signal 120, mode enable signal 122, mode enable signal 124, mode enable signal 126, mode enable signal 128, and mode enable signal 130 are illustrated as being a binary low ("0") signal as transmitted to the input 182 of the latching circuit 152, which results in the mode enable latch signal FastOscEnL that is transmitted from the latching circuit 152 to the input 76 of the oscillation selection circuit 70 being a binary low ("0"). Accordingly, as described above, the SlowOsc signal 116 (e.g., a binary high or "1") is transmitted from the oscillation selection circuit 70 as the Osc 62A', the Osc 62B', the Osc 62C', the Osc 62D', the Osc 62E', the Osc 62F', and the Osc 62G' from the pump oscillator 60 at the first time $t_0$ 132 (i.e., at the first time $t_0$ 132, the Osc 62A', the Osc 62B', the Osc 62C', the Osc 62D', the Osc 62E', the Osc 62F', and the Osc 62G' mirror the SlowOsc signal 116).

As the SlowOsc signal 116 transitions from a binary high ("1") signal to a binary low ("0") signal at the second time $t_1$ 134, the each of mode enable signal 118, mode enable signal 120, mode enable signal 122, mode enable signal 124, mode enable signal 126, mode enable signal 128, and mode enable signal 130 continue being a binary low ("0") signal as transmitted to the input 182 of the latching circuit 152, which results in the mode enable latch signal FastOscEnL that is transmitted from the latching circuit 152 to the input 76 of the oscillation selection circuit 70 to continue to be a binary low ("0"). SlowOsc signal 116 (e.g., a binary low or "0") is transmitted from the oscillation selection circuit 70 as the Osc 62A', the Osc 62B', the Osc 62C', the Osc 62D', the Osc 62E', the Osc 62F', and the Osc 62G' from the pump oscillator 60 at the second time $t_1$ 134 (i.e., at the second time $t_1$ 132, the Osc 62A', the Osc 62B', the Osc 62C', the Osc 62D', the Osc 62E', the Osc 62F', and the Osc 62G' continue to mirror the SlowOsc signal 116, not transitioned to binary low or "0").

As further illustrated in the timing diagram 188, at the third time $t_2$ 136, a mode enable signal 118 transitions from a from a binary low ("O") signal to a binary high ("1") signal. This corresponds to the memory device 10 and/or components transitioning from a low power mode of operation into a high power mode of operation. As illustrated, the transition of the mode enable signal 118 from a from a binary low ("O") signal to a binary high ("1") signal is not accompanied by a switch of the Osc 62A' from mirroring the SlowOsc signal 116 to mirroring the FastOsc signal 114 because while the mode enable signal 118 transitions to a binary high ("1") signal at the third time $t_2$ 136, the binary state of clock signal 114 as the FastOsc signal (e.g., the first clock signal received at input 153 of the mode transition control circuit 150) is binary high ("1") while the clock signal 116 as the SlowOsc signal (e.g., the second clock signal received at input 154 of the mode transition control circuit 150) is binary low ("0"). This causes the binary value at output 156 to be binary low ("0"), reflecting that the FastOsc signal 114 and the SlowOsc signal 116 are in are in differing (i.e., inverse) binary states. This binary value of "0" transmitted to input 184 of the latching circuit 152 as a clock signal prevents the output 186 of the latching circuit 152 from changing (until the input 184 receives a binary high ("1" signal). Accordingly, the oscillator signal 62 (i.e., the Osc 62A') transmitted from the oscillation selection circuit 70 is not increased in frequency from the frequency of the SlowOsc signal 116 to the frequency of the FastOsc signal 114 at the third time $t_2$ 136, eliminating any potential for the generation of a pulse at the third time $t_2$ 136 having a width that may be shorter in width than subsequent pulses for the Osc 62A'.

Likewise, in a separate operation from the operation discussed above regarding mode enable signal 118, the mode enable signal 120 may instead transition from a from a binary low ("0") signal to a binary high ("1") signal at a fourth time $t_3$ 138 instead of at the third time $t_2$ 136. This corresponds to the memory device 10 and/or components transitioning from a low power mode of operation into a high power mode of operation at the fourth time $t_3$ 138. As illustrated, the transition of the mode enable signal 120 from a from a binary low ("0") signal to a binary high ("1") signal is not accompanied by a switch of the Osc 62B' from mirroring the SlowOsc signal 116 to mirroring the FastOsc signal 114 because while the mode enable signal 120 transitions to a binary high ("1") signal at the fourth time $t_3$ 138, the binary state of clock signal 114 as the FastOsc signal (e.g., the first clock signal received at input 153 of the mode transition control circuit 150) is binary high ("1") while the clock signal 116 as the SlowOsc signal (e.g., the second clock signal received at input 154 of the mode transition control circuit 150) is binary low ("0"). This causes the binary value at output 156 to be binary low ("0"), reflecting that the FastOsc signal 114 and the SlowOsc signal 116 are in are in differing (i.e., inverse) binary states. This binary value of "0" transmitted to input 184 of the latching circuit 152 as a clock signal prevents the output 186 of the latching circuit 152 from changing (until the input 184 receives a binary high ("1" signal). Accordingly, the oscillator signal 62 (i.e., the Osc 62B') transmitted from the oscillation selection circuit 70 is not increased in frequency from the frequency of the SlowOsc signal 116 to the frequency of the FastOsc signal 114 at the fourth time $t_3$ 138, eliminating any potential for the generation of a pulse at the fourth time $t_3$ 138 having a width that may be shorter in width than subsequent pulses for the Osc 62B'.

In other operations separate from the operations discussed above regarding mode enable signal 118 and mode enable signal 120, the mode enable signal 122 may instead transition from a from a binary low ("0") signal to a binary high ("1") signal during a time period 140 starting at a fifth time $t_4$ 142 and ending at a sixth time $t_5$ 144 instead of at the third time $t_2$ 136 or the fourth time $t_3$ 138. This corresponds to the memory device 10 and/or components transitioning from a low power mode of operation into a high power mode of operation at various times during the time period 140. As illustrated, the transition of the mode enable signal 122 from a from a binary low ("0") signal to a binary high ("1") signal is not accompanied by a switch of the Osc 62C' from mirroring the SlowOsc signal 116 to mirroring the FastOsc signal 114 (the Osc 62C' is not increased in frequency from the frequency of the SlowOsc signal 116 to the frequency of the FastOsc signal 114 at the fifth time $t_4$ 142) because while the mode enable signal 122 transitions to a binary high ("1") signal at the fifth time $t_4$ 142, the binary state of clock signal 114 as the FastOsc signal (e.g., the first clock signal received at input 153 of the mode transition control circuit 150) is binary high ("1") while the clock signal 116 as the SlowOsc signal (e.g., the second clock signal received at input 154 of the mode transition control circuit 150) is binary low ("0"). This causes the binary value at output 156 to be binary low ("0"), reflecting that the FastOsc signal 114 and the SlowOsc signal 116 are in are in differing (i.e., inverse) binary states. This binary value of "0" transmitted to input 184 of the latching circuit 152 as a clock signal prevents the output 186 of the latching circuit 152 from changing (until the input 184 receives a binary high ("1" signal). Accordingly, the oscillator signal 62 (i.e., the Osc 62C') transmitted from the oscillation selection circuit 70 is not increased in frequency from the frequency of the SlowOsc signal 116 to the frequency of the FastOsc signal 114 at the fifth time $t_4$ 142, eliminating any potential for the generation of a pulse at the fifth time $t_4$ 142 having a width that may be shorter in width than subsequent pulses for the Osc 62C'.

Similarly, the transition of the mode enable signal 124, the mode enable signal 126, and the mode enable signal 128 from a from a binary low ("0") signal to a binary high ("1") signal are not accompanied by a switch of the respective Osc 62D', Osc 62E', and Osc 62F' from mirroring the SlowOsc signal 116 to mirroring the FastOsc signal 114 (i.e., the Osc 62D', Osc 62E', and Osc 62F' are increased in frequency from the frequency of the SlowOsc signal 116 to the frequency of the FastOsc signal 114 only after the sixth time $t_5$ 144) because while the he mode enable signal 124, the mode enable signal 126, and the mode enable signal 128 transition to a binary high ("1") signal during the time period 140, the binary state of clock signal 114 as the FastOsc signal (e.g., the first clock signal received at input 153 of the mode transition control circuit 150) is binary high ("1") while the clock signal 116 as the SlowOsc signal (e.g., the second clock signal received at input 154 of the mode transition control circuit 150) is binary low ("0"). This causes the binary value at output 156 to be binary low ("0"), reflecting that the FastOsc signal 114 and the SlowOsc signal 116 are in are in differing (i.e., inverse) binary states. This binary value of "0" transmitted to input 184 of the latching circuit 152 as a clock signal prevents the output 186 of the latching circuit 152 from changing (until the input 184 receives a binary high ("1" signal). Accordingly, the oscillator signal 62 (i.e., the Osc 62D', the Osc 62E', and the Osc 62F') transmitted from the oscillation selection circuit 70 are not increased in frequency from the frequency of the SlowOsc signal 116 to the frequency of the FastOsc signal 114 during the time period 140, eliminating any potential for the generation of a pulse during the time period 140 having a width that may be shorter in width than subsequent pulses for the Osc 62D', the Osc 62E', and the Osc 62F'.

In other operations separate from the operation discussed above regarding the mode enable signal 118, mode enable signal 120, mode enable signal 122, mode enable signal 124, mode enable signal 126, and mode enable signal 128, the mode enable signal 130 may instead transition from a from a binary low ("0") signal to a binary high ("1") signal subsequent to the sixth time t₅ 144. This corresponds to the memory device 10 and/or components transitioning from a low power mode of operation into a high power mode of operation subsequent to the sixth time t₅ 144. As illustrated, the transition of the mode enable signal 130 from a from a binary low ("0") signal to a binary high ("1") signal is accompanied in a switch of the Osc 62G from mirroring the SlowOsc signal 116 to mirroring the FastOsc signal 114 (i.e., the Osc 62G is increased in frequency from the frequency of the SlowOsc signal 116 to the frequency of the FastOsc signal 114 subsequent to the sixth time t₅ 144) because while the mode enable signal 130 transitions to a binary high ("1") signal subsequent to the sixth time t₅ 144, the binary state of clock signal 114 as the FastOsc signal (e.g., the first clock signal received at input 153 of the mode transition control circuit 150) is binary low ("0") while the clock signal 116 as the SlowOsc signal (e.g., the second clock signal received at input 154 of the mode transition control circuit 150) is also a binary low ("0"). This causes the binary value at output 156 to be binary high ("1"), reflecting that the FastOsc signal 114 and the SlowOsc signal 116 are in are the same binary states. This binary value of "1" transmitted to input 184 of the latching circuit 152 as a clock signal allows the output 186 of the latching circuit 152 to change.

However, since the clock signal 114 as the FastOsc signal is a binary low ("0") subsequent to the sixth time t₅ 144, this results in a binary value of "O" generated for the Osc 62G' subsequent to the sixth time t₅ 144 as the oscillator signal 62. The width of the all the pulses generated for the Osc 62G' thereafter may be equivalent due to the transition of the Osc 62G' occurring when the FastOsc signal 114 is in the same binary state as the binary state of the SlowOsc signal 116 (i.e., due to the operation of the oscillation selection circuit 70 in switching of the Osc 62G' from having a frequency equivalent to the SlowOsc signal 116 to having a frequency equivalent to the FastOsc signal 114 while the binary states of the FastOsc signal 114 and the SlowOsc signal 116 are the same).

As further illustrated in the timing diagram 188 of Osc62C' and Osc62D', shortened pulses, for example, present in the Osc 62C and Osc 62D of the timing diagram 112, are eliminated through the use of the mode transition control circuit 150 and the latching circuit 152 in the manner described above, namely, to preclude switching of the oscillator signal 62 by the oscillation selection circuit 70 when the FastOsc signal and the SlowOsc signal are in different (i.e., inverse) binary states by preventing transition of the FastOscEnL signal transmitted to the oscillation selection circuit 70 when the FastOsc signal and the SlowOsc signal are in different (i.e., inverse) binary states.

Figure 7:
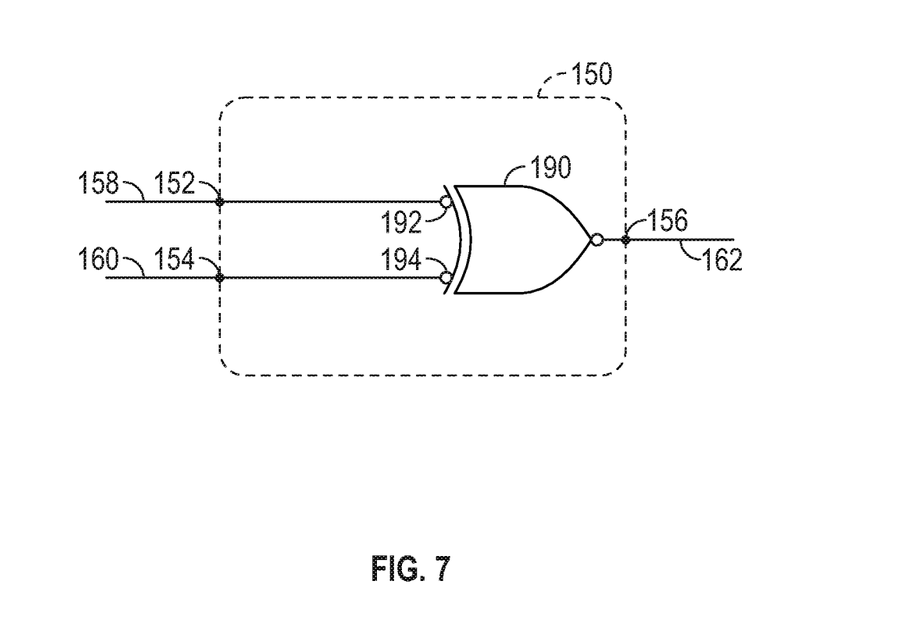
FIG. 7 is a block diagram of a second embodiment of the mode transition control circuit of the charge pump oscillator of FIG. 5.

It is noted that alternative circuitry may be utilized in the mode transition control circuit 150 to generate and transmit an indication of whether the binary state of the input oscillation signals (the SlowOsc signal and the FastOsc signal) are the same or are different. For example, FIG. 7 illustrates the mode transition control circuit 150 as including a (two-input) XNOR gate 190. In operation, the XNOR gate 190 may receive, at input 192, the first clock signal from input 153 (e.g., the clock signal corresponding to the FastOsc signal having a faster frequency than the SlowOsc signal). The XNOR gate 190 may also receive, at input 194, the second clock signal from input 154 (e.g., corresponding to a second clock signal, the SlowOsc signal having a slower frequency than the FastOsc signal). If, for example, if FastOsc is a binary low and SlowOsc is a binary low (or if FastOsc is a binary high and SlowOsc is a binary high), the XNOR gate 190 will generate a binary high value of "1" at output 156 (e.g., the XNOR gate 190 generates a result of "1" indicative of no difference in the binary states of SlowOsc and FastOsc). Likewise, for example, if FastOsc is a binary high and SlowOsc is a binary low (or if FastOsc is a binary low and SlowOsc is a binary high), the XNOR gate 190 will generate a binary high value of "0" at output 156 (e.g., the XNOR gate 190 generates a result of "0" indicative of a difference in the binary states of SlowOsc and FastOsc).

In this manner, the binary value at output 156 is binary high ("1") when the FastOsc signal and the SlowOsc signal are in a common binary state. Furthermore, the binary value at output 156 is binary low ("0") when the FastOsc signal and the SlowOsc signal are in differing (i.e., inverse) binary states. Thus, the mode transition control circuit 150 operates to generate and transmit an indication of whether the input oscillation signals have the same binary state as one another (i.e., both of the SlowOsc signal and the FastOsc signal have a binary high or "1" value or a binary low or "0" value). It should be appreciated that alternative circuitry may be employed by the mode transition control circuit 150 to generate the indication described above at output 156.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
a plurality of memory cells;
first circuitry coupled the plurality of memory cells, wherein the first circuitry is configured to perform a memory operation on at least one memory cell of the plurality of memory cells; and
a charge pump coupled to the first circuitry, wherein the charge pump comprises:
a pump oscillator configured to generate an oscillator signal having only pulses with a width above a predetermined threshold pulse width to prevent runt pulses in the oscillator signal; and
a pump core configured to receive the oscillator signal and a first electrical power signal at a first voltage, generate a second electrical power signal at a second voltage based upon the oscillator signal and the first voltage.

2. The memory device of claim 1, wherein the charge pump is configured to provide the second electrical power signal to the first circuitry.

3. The memory device of claim 1, wherein the charge pump comprises a pump controller coupled to the pump oscillator and the pump core.

4. The memory device of claim 3, wherein the pump controller is configured to transmit an activating signal to control an operation of the pump core.

5. The memory device of claim 3, wherein the pump controller is configured to transmit a control signal to control an operation of the pump oscillator.

6. The memory device of claim 5, wherein the control signal is configured to indicate that the memory device is in a low power mode of operation or that the memory device is entering into the low power mode of operation.

7. The memory device of claim 6, wherein the pump oscillator is configured to generate the oscillator signal as corresponding to a low frequency oscillator signal based upon the control signal.

8. The memory device of claim 5, wherein the control signal is configured to indicate that the memory device is in a high power mode of operation or that the memory device is entering into the high power mode of operation.

9. The memory device of claim 8, wherein the pump oscillator is configured to generate the oscillator signal as corresponding to a high frequency oscillator signal based upon the control signal.

10. The memory device of claim 5, wherein the operation of the pump oscillator comprises generation of the oscillator signal at a first frequency or a second frequency.

11. The memory device of claim 10, wherein the first frequency corresponds to operation of the memory device in a low power mode of operation, wherein the second frequency corresponds to operation of the memory device in a high power mode of operation, wherein memory device consumes less power in the low power mode of operation relative to the high power mode of operation.

12. A device, comprising:
a pump controller configured to transmit a control signal; and
a pump oscillator coupled to the pump controller, wherein the pump oscillator comprises:
a mode transition control circuit comprising:
a first input configured to receive a first oscillation signal having a first frequency;
a second input configured to receive a second oscillation signal having a second frequency; and
an output configured to provide a selection signal generated by the mode transition control circuit based upon the first oscillation signal and the second oscillation signal;
a latching circuit coupled to the mode transition control circuit, wherein the latching circuit comprises:
a third input configured to receive the control signal;
a fourth input configured to receive the selection signal; and
a second output configured to provide a latched mode enable signal generated by the latching circuit based upon the control signal and the selection signal; and
an oscillation selection circuit coupled to the latching circuit, wherein the oscillation selection circuit comprises:
a fifth input configured to receive the first oscillation signal;
a sixth input configured to receive the second oscillation signal;
a seventh input configured to receive the latched mode enable signal; and
a third output configured to provide an oscillator signal generated by the oscillation selection circuit based upon the first oscillation signal, the second oscillation signal, and the latched mode enable signal.

13. The device of claim 12, wherein the mode transition control circuit comprises an XOR gate or an XNOR gate coupled to the first input, the second input, and the output, wherein the XOR gate or the XNOR gate is configured to generate the selection signal.

14. The device of claim 12, wherein the mode transition control circuit is configured to generate the selection signal as having a binary low value when the first oscillation signal and the second oscillation signal are in differing binary states.

15. The device of claim 12, wherein the mode transition control circuit is configured to generate the selection signal as having a binary high value when the first oscillation signal and the second oscillation signal are in a common binary state.

16. The device of claim 12, wherein the latching circuit is configured to generate the latched mode enable signal as having a binary value equal to a binary value of the control signal when the selection signal has a binary high value.

17. The device of claim 12, wherein the oscillation selection circuit comprises selection circuitry configured to select one of the first oscillation signal or the second oscillation signal as the oscillator signal based upon a binary value of the latched mode enable signal.

18. The device of claim 12, comprising a pump core coupled to the pump controller and the pump oscillator, wherein the pump core is configured to receive the oscillator signal from the pump oscillator, receive a first electrical power signal at a first voltage, and generate a second electrical power signal at a second voltage based upon the oscillator signal and the first voltage.

19. A memory device comprising:
a memory controller configured to generate a control signal indicative of a mode of operation of the memory device; and
a memory bank coupled to the memory controller, wherein the memory bank comprises:
a memory cell array configured to store data;
circuitry coupled to the memory cell array and configured to perform or facilitate a memory operation of the memory cell array; and
a charge pump coupled to the circuitry and the memory controller and configured to receive the control signal and provide an electrical power signal to the circuitry, wherein the charge pump comprises:
a pump oscillator configured to generate an oscillator signal having only pulses with a width above a predetermined threshold pulse width to prevent runt pulses in the oscillator signal; and
a pump core configured to receive the oscillator signal and generate the electrical power signal based in part upon the oscillator signal.

20. The memory device of claim 19, wherein the pump oscillator is configured to selectively generate the oscillator signal as having a first frequency when the control signal has a first binary value and selectively generate the oscillator signal as having a second frequency when the control signal has a second binary value that differs from the first binary value.

* * * * *